US012666527B2

(12) United States Patent

Yu et al.

(10) Patent No.: US 12,666,527 B2

(45) Date of Patent: Jun. 23, 2026

(54) THERMAL CONDUCTION—ELECTRICAL CONDUCTION ISOLATED CIRCUIT BOARD WITH CERAMIC SUBSTRATE AND POWER TRANSISTOR EMBEDDED

(71) Applicants: ICP Technology Co., LTD., Taoyuan (TW); SENTEC E&E CO., LTD., Taoyuan (TW)

(72) Inventors: Ho-Chieh Yu, Taoyuan (TW); Chen-Cheng-Lung Liao, Taoyuan (TW); Chun-Yu Lin, Taoyuan (TW); Jason An Cheng Huang, Taoyuan (TW); Chih-Chuan Liang, Taoyuan (TW); Kun-Tzu Chen, Taoyuan (TW); Nai-His Hu, Taoyuan (TW); Liang-Yo Chen, Taoyuan (TW)

(73) Assignees: ICP Technology Co., LTD., Taoyuan (TW); SENTEC E&E CO., LTD., Taoyuan (TW)

( * ) Notice: Subject to any disclaimer, the term of this patent is extended or adjusted under 35 U.S.C. 154(b) by 883 days.

(21) Appl. No.: 17/956,544

(22) Filed: Sep. 29, 2022

(65) Prior Publication Data

US 2024/0114614 A1     Apr. 4, 2024

(51) Int. Cl.
*H05K 1/02*        (2006.01)
*H05K 1/03*        (2006.01)
*H05K 3/00*        (2006.01)

(52) U.S. Cl.
CPC ........... *H05K 1/021* (2013.01); *H05K 1/0206* (2013.01); *H05K 1/0306* (2013.01); *H05K 3/0061* (2013.01); *H05K 2201/10166* (2013.01)

(58) Field of Classification Search
CPC ........... H05K 1/00–021; H05K 1/0306; H05K 2201/10166
See application file for complete search history.

(56) References Cited

U.S. PATENT DOCUMENTS

| | | | | |
|---|---|---|---|---|
| 2018/0352646 | A1* | 12/2018 | Yu | H05K 1/0204 |
| 2021/0043544 | A1* | 2/2021 | Eid | H01L 23/481 |
| 2021/0217681 | A1* | 7/2021 | Qin | H01L 24/24 |
| 2022/0406692 | A1* | 12/2022 | Stoek | H01L 21/4842 |

* cited by examiner

*Primary Examiner* — Jacob Y Choi
*Assistant Examiner* — Dave Tan
(74) *Attorney, Agent, or Firm* — Che-Yang Chen; Law Office of Michael Chen

(57) ABSTRACT

Disclosed is a thermal conduction-electrical conduction isolated circuit board with a ceramic substrate and a power transistor embedded, mainly comprising: a dielectric material layer, a heat-dissipating ceramic block, a securing portion, a stepped metal electrode layer, a power transistor, and a dielectric material packaging, wherein a via hole is formed in the dielectric material layer, the heat-dissipating ceramic block is correspondingly embedded in the via hole, the heat-dissipating ceramic block has a thermal conductivity higher than that of the dielectric material layer and a thickness less than that of the dielectric material layer, the stepped metal electrode layer conducts electricity and heat for the power transistor, the dielectric material packaging is configured to partially expose the source connecting pin, drain connecting pin, and gate connecting pin of the encapsulated stepped metal electrode layer.

10 Claims, 6 Drawing Sheets

THERMAL CONDUCTION—ELECTRICAL CONDUCTION ISOLATED CIRCUIT BOARD WITH CERAMIC SUBSTRATE AND POWER TRANSISTOR EMBEDDED

FIELD

The disclosure relates to a printed circuit board, and more particularly relates to a thermal conduction-electrical conduction isolated circuit board with a ceramic substrate and a power transistor embedded.

BACKGROUND

A printed circuit board (PCB) serves for mounting of electronic components. Copper-clad laminate (CCL) is the fundamental building block of the PCB. The CCL generally comprises an insulation layer made of a dielectric material and a conductive material layer formed by copper foil wires, wherein the conductive material layer is laid over the insulation layer. The dielectric material is mainly prepared from an insulation material impregnated in resin. Such insulation material includes paper phenolic, phenolic composition, glass fiber cloth, rubber, or other polymer materials. To ease the illustration, the CCL insulation layer is hereinafter referred to as dielectric material layer.

To meet increasingly complex and versatile demands in circuit design, the PCB structures have been gradually developed from single-layered PCBs to double-layered PCBs and multi-layered PCBs. A conventional multi-layered PCB comprises multiple layers of dielectric material layers and conductive material layers stacked up to form a more complex and versatile circuit, wherein wires on respective layers of the multi-layered PCB are connected by electrically conductive plugs through via holes formed in the dielectric material layers, thereby achieving the objective of accommodating more electronic components with a smaller footprint. The market-available FR-4, FR-5, FR-6, and FR-7, etc. are all typical materials used in multi-layered PCBs.

With constant miniaturization of electronic devices, electric components for special demands are developed towards a higher power; so, a larger heat energy would be produced in a smaller space. Particularly, the smaller space requires shrinkage of both circuit line spacing and wire diameter. For example, on a substrate made of a base material such phenolic composition or glass fiber cloth, the circuit line spacing has been reduced to approximately 50 μm, aggravating the heat accumulation-induced high temperature issue in the circuit industry, which is hard to tackle.

To enhance heat dissipation efficiency, conventional technologies provide the following approaches. In a first approach, the heat energy produced from electronic components is generally diffused to the air or surroundings around the PCB via heat convection or heat radiation; however, the heat-dissipation efficiency of this approach is unsatisfactory. In a second approach, the heat energy is conducted via metal wires or heat sinks of a better heat conduction property; although this construction offers a better heat dissipation effect than only using a dielectric material, the heat-dissipation efficiency of this approach is not so high due to small diameters of metal wires; moreover, the heat sinks are usually affixed to the PCB via a material such as a thermally conductive adhesive which has a thermal conductivity far lower than that of metal, such that even a fan is installed at the remote end of the heat sink distant from the electronic component, its thermal conduction effect is still significantly dampened.

A currently widely-adopted solution is to use a ceramic material as the dielectric material layer of the circuit substrate. The most common ceramic for fabricating a DBC (Direct Bonded Copper) substrate is $Al_2O_3$ (aluminum oxide), whose thermal conductivity may reach 35 Wm-1K-1 in a monocrystalline construction and 20 to 27 Wm-1K-1 in a polycrystalline construction. Other common materials for ceramic substrates include MN (aluminum nitride), BeO (beryllium oxide), and SiC (silicon carbide), etc. Since the ceramic materials of a good thermal conduction property are usually used in circuit substrates bearing high-power electronics, such substrates are sometimes referred to as power electronic substrates.

However, some issues still occur to a PCB fabricated with a ceramic substrate. Although the wire diameter of the circuit may be made as thin as 30 μm, since the substrate is usually subjected to high-temperature firing, slight expansion inhomogeneity and warpage likely occur during the firing process such that the precision of the substrate does not match that of the PCB, causing the substrate unsuitable for fabricating a multi-layered PCB; on the other hand, during the high-temperature process, the metal atoms of the circuit are easily disassociated and diffused, requiring that the circuit line spacing be kept at substantially 80 μm. Therefore, in addition to increasing manufacture cost, a ceramic substrate used for fabricating a PCB further brings other problems, such as irreducibility in wire width and circuit line spacing, imprecise positioning of the wires on the circuit, and difficulty in miniaturizing the electronic device with a whole sheet of ceramic substrate applied.

Therefore, for a high-heat-development electronic component, the invention patents No. I670998 and I690246 issued to the applicant of the present application provide a solution of pre-drilling a via hole in the printed circuit substrate, and then embedding a ceramic block with a size corresponding to that of the high-power electronic component into the via hole, arranging the printed circuit board to be flush with the heat-dissipating ceramic block at both top and bottom, and disposing the high power electronic component on the embedded heat-dissipating ceramic block; in this way, the high heat energy developed from the high power electronic device may be conducted out from beneath the embedded block, and on the other hand, the surrounding printed circuit board may meet complex demands in circuit connection; as such, the heat-dissipating ceramic block and the printed circuit board function to fulfill thermal conduction and electrical signal conduction, respectively. However, with constantly increasing power consumption of electric vehicles and computers as well as market demands on miniaturized circuits, it is needed to further improve heat-dissipation effect and component footprint of conventional solutions.

In addition, in the aforementioned patents issued to the present applicant, although such high-heat-development electronic components (e.g., high-power electronics (IGBT) are securely welded to a pad above the heat-dissipating ceramic block by SMT (surface-mount technology), it is still needed to connect respective IGBT electrodes to the corresponding pad on an external PCB at least partially via metal leads; particularly, if an aluminum bar, for example, is used to conduct large current of several or even dozens of amperes, an ultrasonic probe is needed to press-weld the aluminum bar, which increases processing complexity. A fully exposed meal pad with a large footprint may facilitate circuit design and fabrication.

Hereinafter, the detailed features and benefits of the disclosure will be elaborated in the embodiments, the contents of which suffice for those skilled in the art to understand and implement the technical solution of the disclosure; in addition, any person skilled in the art may easily understand the objectives and advantages of the disclosure through reading the specification, the claims, and the drawings provided herein.

SUMMARY

In an aspect, a thermal conduction-electrical conduction isolated circuit board with a ceramic substrate and a power transistor embedded is provided, wherein a high power component and a heat-dissipating ceramic block are both embedded in the circuit board, whereby to reduce the thickness of the heat-dissipation ceramic block and effectively enhance the overall thermal conduction efficiency.

In another aspect, a thermal conduction-electrical conduction isolated circuit board with a ceramic substrate and a power transistor embedded is provided, wherein a high power component is directly embedded in the circuit board, which significantly improves space utilization of the circuit board and facilitates miniaturization.

In a further aspect, a thermal conduction-electrical conduction isolated circuit board with a ceramic substrate and a power transistor embedded is provided, wherein respective connecting pins corresponding to the source, drain and gate of an embedded power transistor are conductively exposed to the side of the circuit board opposite the ceramic block, respectively, whereby to further enhance the thermal-conduction and electrical conduction isolation effect.

In a still further aspect, a thermal conduction-electrical conduction isolated circuit board with a ceramic substrate and a power transistor embedded is provided, wherein circuit design becomes convenient and reliable due to exposed connecting portions.

In an embodiment, the present disclosure provides a thermal conduction-electrical conduction isolated circuit board with a ceramic substrate and a power transistor embedded, comprising: a dielectric material layer comprising a first upper surface and a first lower surface opposite the first upper surface, the dielectric material layer being formed with at least one via hole running through the first upper surface and the first lower surface; at least one heat-dissipating ceramic block correspondingly embedded in the via hole, comprising a second upper surface and a second lower surface, wherein the heat-dissipating ceramic block has a thermal conductivity higher than that of the dielectric material layer and a thickness less that of the dielectric material layer; at least one securing portion which secures the embedded heat-dissipating ceramic block in the via hole of the dielectric material layer such that the second lower surface corresponds to the first lower surface; a stepped metal electrode layer thermally conductively provided on the second upper surface, the stepped metal electrode layer at least comprising one of a source connecting pin or a drain connecting pin, the source connecting pin being partitioned into a thin pad portion and a source connecting portion extending from the thin pad portion, the drain connecting pin being partitioned into a thin pad portion and a drain connecting portion extending from the thin pad portion; a power transistor electrically and thermally conductively mounted on the stepped metal electrode layer, the power transistor at least comprising a source, a gate, and a drain, wherein the source is electrically conductively connected to the source connecting pin, the drain is electrically conductively connected to the drain connecting pin; wherein alternatively, the stepped metal electrode layer comprises the other one of the source connecting pin or the drain connecting pin, and a gate connecting pin, the source connecting pin being electrically connected to the source, the drain connecting pin being electrically connected to the drain, the gate connecting pin being electrically connected to the gate, wherein the drain connecting pin at least comprises a drain connecting portion, the source connecting pin at least comprises a source connecting portion, and the gate connecting pin at least comprises a gate connecting portion; and a dielectric material packaging filling the via hole, wherein the dielectric material packaging encapsulates the second upper surface, the thin pad portion, and the power transistor, whereby to form a third upper surface flush with the first upper surface, and the third upper surface is configured to at least partially expose the source connecting portion of the source connecting pin, the drain connecting portion of the drain connecting pin, and the gate connecting portion of the gate connecting pin, respectively.

The thinner ceramic block enables the heat-generating surface of the power transistor to conduct heat energy out via a shorter path, which enhances thermal conduction performance and ensures that the operating environment temperature rise may be well controlled; the embedding setting of the power transistor yields more mounting footprint on the circuit board, offering better miniaturization of the circuit board; particularly, the power transistor is conducted out via large-footprint, electrically conductive pins, rendering circuit design and connection more convenient and reliable; besides, the circuit direction is opposite to the heat energy conducting-out direction, which further reduces heat interference of the heat energy developed from the power transistor on the operating environment of other components.

DETAILED DESCRIPTION

Figure 1:
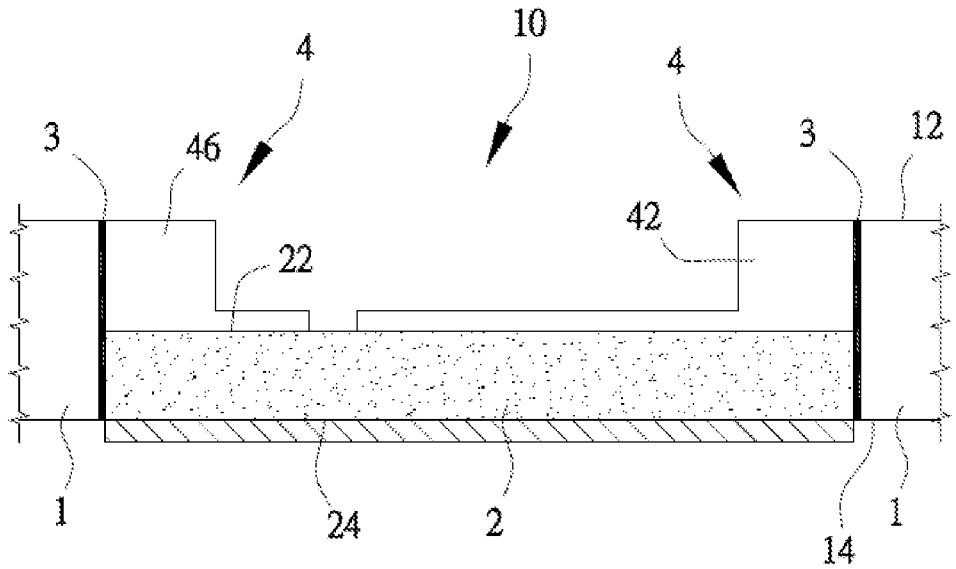
FIGS. 1 to 4 are side section views showing respective phases of a process of fabricating a thermal conduction-electrical conduction isolated circuit board with a ceramic substrate and a power transistor embedded according to a first implementation of the disclosure.

FIGS. 1 to 5 illustrate a first implementation of a thermal conduction-electrical conduction isolated circuit board with a ceramic substrate and a power transistor embedded according to the disclosure, wherein the building block of the circuit board is a FR-4 multi-layered dielectric material layer 1 with a length and a width each being of 10 cm, a via hole 10 with a length and a width each being of 10 cm is pre-drilled for example by laser in the dielectric material layer 1, and a corresponding $Al_2O_3$ heat-dissipating ceramic block 2 of a square column shape is embedded in the via hole 10. However, as those skilled in the art can easily appreciate, the size of the FR-4 substrate in this implementation may vary between 10 $cm^2$ to 3600 $m^2$ without affecting implementation of the disclosure.

For the convenience of illustration, based on the directions shown in the figures, the surface of the dielectric material layer 1 presented at the upper side of FIGS. 1 through 4 is referred to as a first upper surface 12 and the opposite lower surface is referred to as a first lower surface 14, while the upper and lower surfaces of the heat-dissipating ceramic block 2 are referred to as a second upper surface 22 and a second lower surface 24, respectively, the thermal conductivity of the heat-dissipating ceramic block 2 being higher than that of the dielectric material layer 1, the thickness of the heat-dissipating block 2 being less than that of the dielectric material layer 1. Of course, those skilled in the art may easily understand that the dielectric material layer 1 may also be a pre-impregnated substrate prepared from FR-1 (generally referred to as phenolic composition), FR-3, FR-6, and G-10 or other epoxy resin or glass fiber cloth; the drilling may alternatively be a mechanical drilling or the like; the heat-dissipating ceramic block 2 may alternatively select from silicon nitride ($Si_3N_4$), aluminum nitride (AlN), silicon carbide (SiC), beryllium oxide (BeO), which have no impact on implementation of the disclosure.

In this implementation, a securing part 3, e.g., an epoxy resin adhesive, fills the gap between the outer peripheral edge of the heat-dissipating ceramic block 2 and the inner edge of the via hole 10 of the FR-4 dielectric material layer 1; after the adhesive is cured, the securing part 3 may securely bond the outer peripheral edge of the heat-dissipating ceramic block 2 and the inner edge of the via hole 10; in addition, the adhesive-cured securing part 3 also has a flexibility higher than that of the heat-dissipating ceramic block 2; therefore, the adhesive provides a mechanical buffering, such that even the bonded materials have different thermal expansion coefficients, the securing part 3 may still provide a buffer protection. Of course, those skilled in the art may easily understand that although this implementation is illustrated with the epoxy resin adhesive as an example, a silicon base or other flexible adhesive material is also allowed, which has no impact on implementation of the disclosure. In this implementation, the bonding approach also results in flushness between the second lower surface 24 and the first lower surface 14. In addition, since the second lower surface 24 of the heat-dissipating ceramic block 2 is the main heat-dissipation path, an additional heat-dissipation metal layer (not marked) may be provided, with the heat sinks (not shown) being thermally conductively mounted underneath the heat-dissipating metal layer, depending on design needs. Of course, those skilled in the art would easily appreciate that in this implementation, the correspondence between the second lower surface 24 and the first lower surface 14 may also be designed such that the heat-dissipating metal layer is flush with the first lower surface 14, which has no impact on implementing the disclosure.

Figure 5:
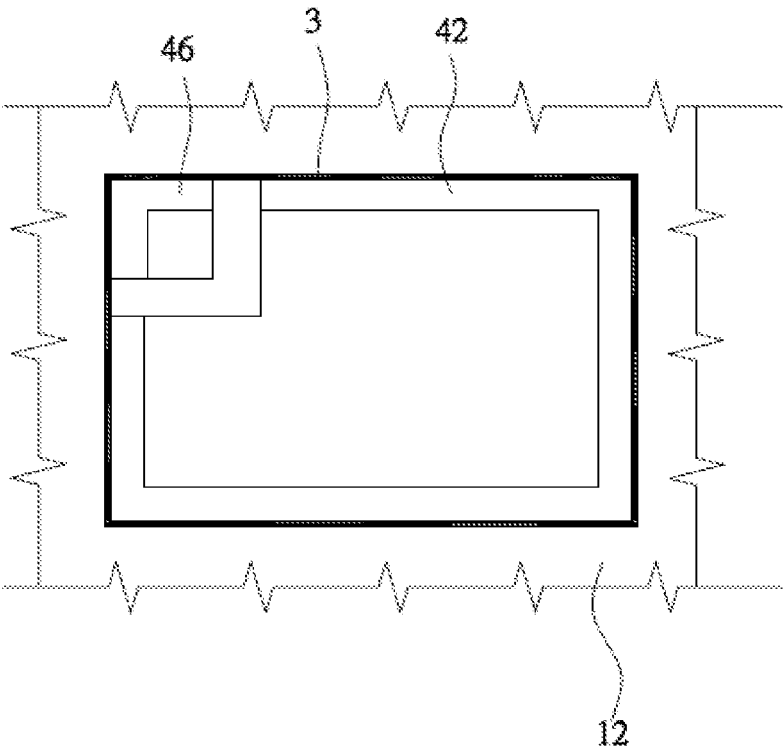
FIG. 5 is a top view showing the status of FIG. 1.

In this implementation, a stepped metal electrode layer 4 may be provided thermally conductively on the second upper surface 22; as illustrated in FIG. 5 the stepped metal electrode layer 4 comprises a source connecting pin 42 and a gate connecting pin 46, the source connecting pin 42 being partitioned into a thin pad portion 420 and a source connecting portion 422, the gate connecting pin 46 being partitioned into a thin pad portion 460 and a gate connecting portion 46; since the power transistor in this implementation is arranged in such a manner that the source and the gate are coplanar while the drain is located on the opposite surface, the thin pad portion 420 and the thin pad portion 460, which are coplanar and mutually electrically insulated, are provided on the second upper surface 22 for thermal conduction, while the source connecting portion 422 and the gate connecting portion 462 extend upward from the thin pad portion 420 till at least the same height as the first upper surface 12 of the dielectric material layer 1, such that the source connecting portion 422 and the thin pad portion 420 extend in a generally bent manner. It may be seen from the top view of FIG. 5 that since the gate has a low current flux, its pin footprint is far smaller than that of the source; therefore, the footprint of the source connecting portion 422 of the source connecting pin 42 exposed to the first upper surface is notably larger, thereby allowing more current to travel through.

Figure 2:
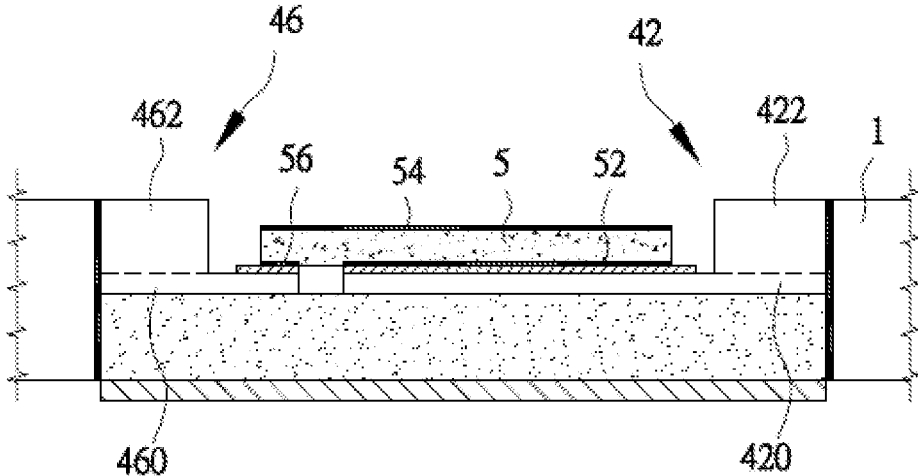

As illustrated in FIG. 2, on the thin pad portions 420, 460 of the stepped metal electrode layer is directly electrically conductively and thermally conductively mounted a power transistor 5. Since the source 52 and the gate 56 of the power transistor 5 are presented at the lower side of the figure, they are for example soldered to the thin pad portions 420, 460, respectively; and with the large-footprint thin pad portion 420, a large amount of heat energy developed from the power transistor 5 is conducted downwardly. Tests show that the operating environment temperature rise of the power transistor caused by temperature difference of the ceramic block whose thickness has been significantly reduced to even hundreds of micrometers (μm) is limited to 1° C. or less from the original 3° C., resulting in a significant improvement in the overall heat dissipation effect.

Figure 3:
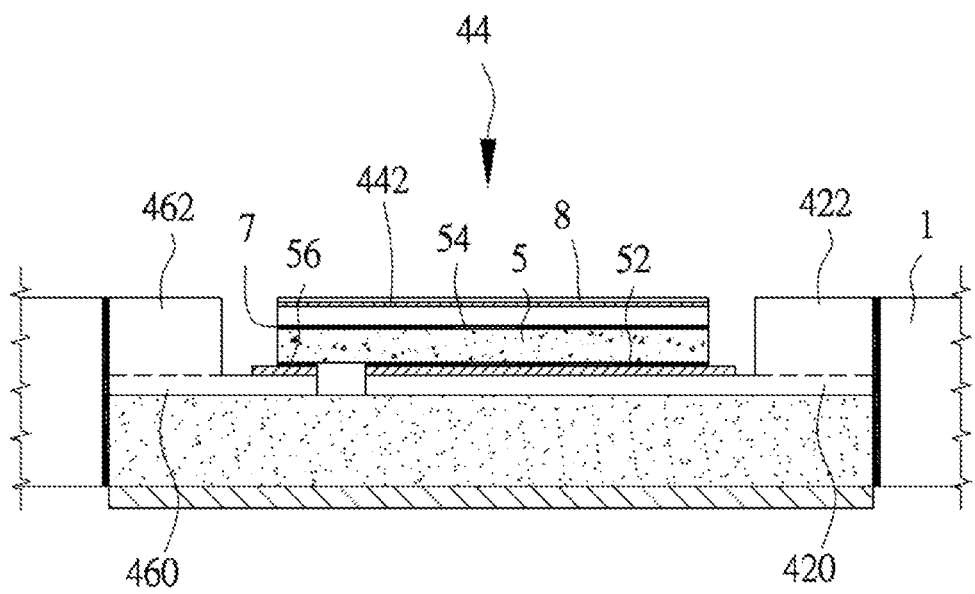

In this implementation, the drain 54 of the power transistor 5 is presented at the upper side of FIG. 2; therefore, in the subsequent FIG. 3, a drain connecting pin 44 is conductively mounted in the plane above the drain 54 of the power transistor 5; the drain connecting pin 44 in this implementation only comprises a single-layered copper layer 8, which is here referred to as a drain connecting portion 442, wherein the drain connecting portion 442 is disposed at a position opposite the thin pad portions 420, 460 of the source connecting pin 42 and gate connecting pin 46. Moreover, in this implementation, an interface nano-silver adhesive layer 7 for bonding is provided between the copper layer of the drain connecting portion 422 and the drain 54 of the power transistor 5, allowing for the copper layer 8 of several millimeters to be reliably electrically conductively bonded to the drain 54, wherein the thickness of the drain connecting portion 442 may be exactly flush at least with the first upper surface, whereby to be exposed to the upper side of the circuit board.

Figure 4:
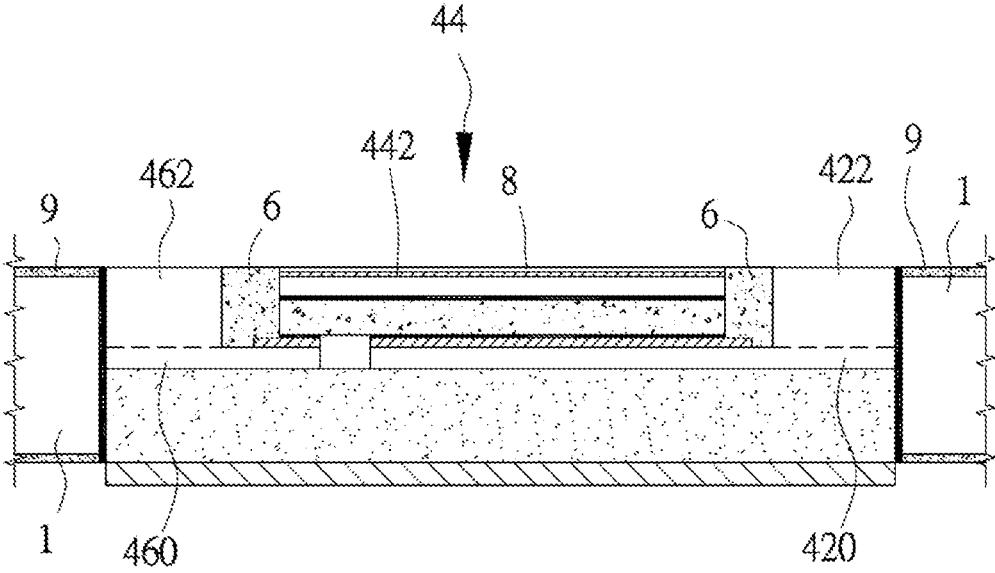
Figure 6:
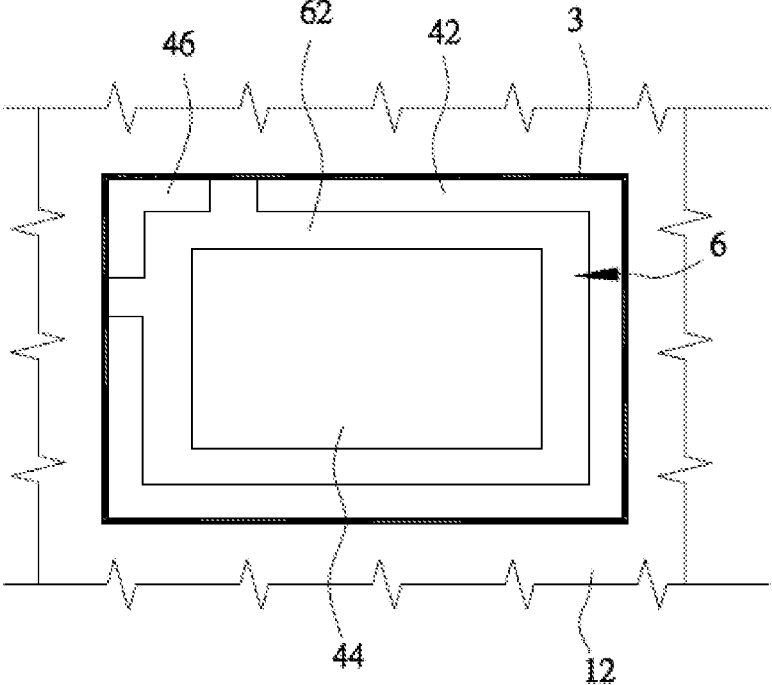
FIG. 6 is a top view of the packaged status of FIG. 4 according to the first implementation of the disclosure.

As illustrated in FIGS. 4 and 6, a dielectric material packaging 6 (which may be epoxy resin adhesive) filling the via hole 10 is configured to encapsulate the second upper surface 22, the thin pad portions 420, 460, and the power transistor 5, whereby to form a third upper surface 62 flush with the first upper surface 12. Via the dielectric material packaging 6, the source connecting portion 422 of the source connecting pin, the gate connecting portion 462 of the gate connecting pin 46, and the drain connecting portion 442 of the drain connecting pin 44 are exposed to form contacts exposed at the upper side of the circuit board. Of course, as those skilled in the art would easily appreciate, if tolerances exist, polishing may be performed to cause the first upper surface 12, the third upper surface 62, and all of the source connecting portion 422, the gate connecting portion 462, and the drain connecting portion 442 to be flush so as to facilitate docking of a circuit component on the dielectric material layer with the source 52, drain 54, and gate 56 of the power transistor 4; of course, the first upper surface 12 may also refer to a top surface on which a circuit layer 9 has been completely laid on the FR-4 substrate, such that the circuit layer 9 may be disposed above the first upper surface 12 and the third upper surface 62 and coplanar with the exposed source connecting pin 42, drain connecting pin 44, and gate connecting pin 46.

In view of the above, the present disclosure mainly achieves improvement of the heat dissipation effect of conventional structures by reducing the thickness of the heat-dissipating ceramic block 2 to be far thinner than that the dielectric material layer 1, while the height difference between the heat-dissipating ceramic block 2 and the dielectric material layer 1 allows for embedding of the power transistor 5, which may not only effectively ensure the operating temperature environment of the power transistor, but also may reduce the overall thickness of the substrate, thereby effectively utilizing the layout footprint of the circuit board while ensuring a good thermal conduction-electrical conduction isolation property. In addition, the optimal positioning of the source 52, drain 54, and gate 56 of the power transistor 5 maximizes the conduction footprint, whereby to allow large current to travel through without affecting the overall thermal conduction effect and thickness.

It is particularly stressed that the power transistor 5 is securely welded to the pad above the heat-dissipating ceramic block 2 by SMT (Surface-Mount Technology). With the large contact footprint of the thin pad portion, even the power transistor 5 is applied to an electronic device with high power consumption such as electric vehicle, air-conditioner, refrigerator, sound equipment, motor actuator, and high-power computer, etc., the low thermal resistance enables a large amount of heat energy produced from the power transistor 5 to be directly conducted downward to the highly thermally conductive layer (not marked) via the Al$_2$O$_3$ heat-dissipating ceramic block 2, so as to be conducted away from the position of the heat-dissipating ceramic block 2 via the heat sinks or thermally conductive pipes in the rear, which further ensures that the performance of the circuit components mounted on the dielectric material layer is not affected by high temperature.

Figure 7:
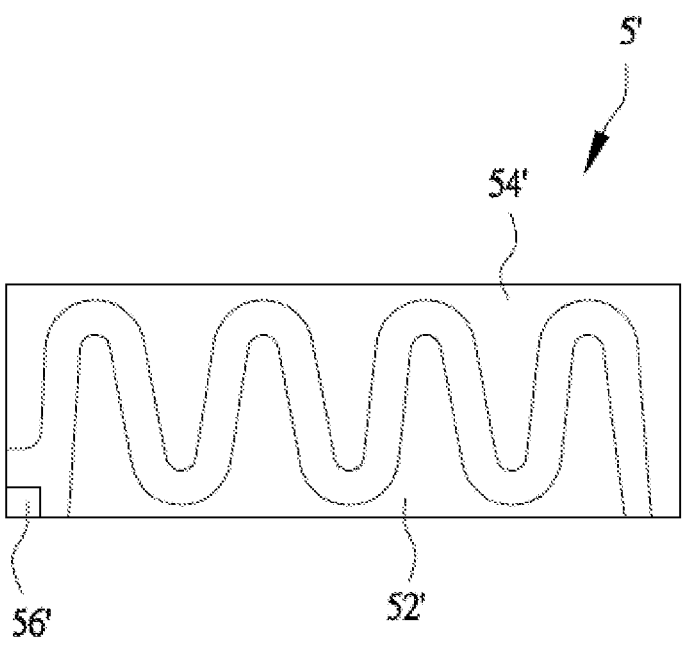
FIG. 7 is a bottom view of a power transistor according to a second implementation of the disclosure, illustrating a co-planar configuration of its source, gate, and drain.
Figure 8:
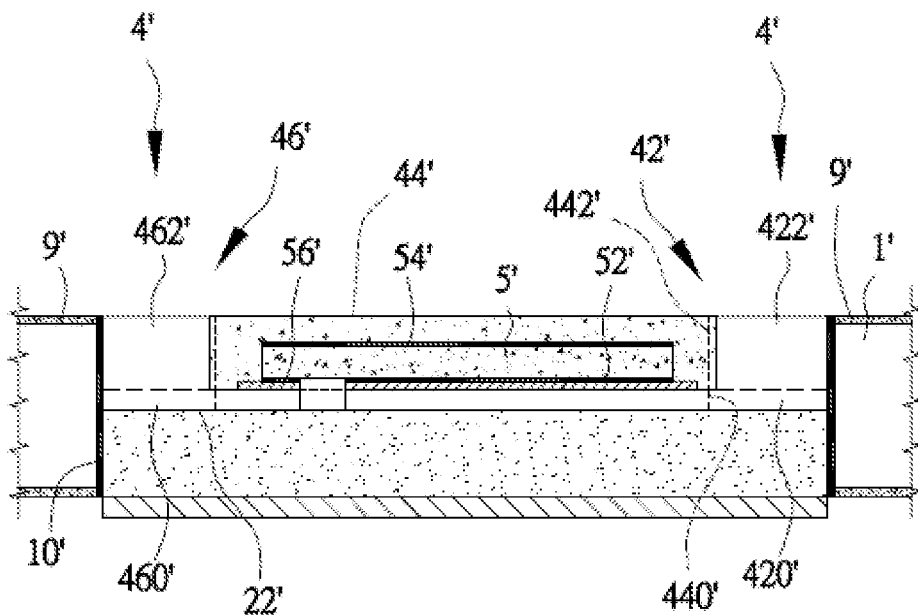
FIG. 8 is a sectional view of the packaged circuit board according to the second implementation of the disclosure.
Figures 9, 10:
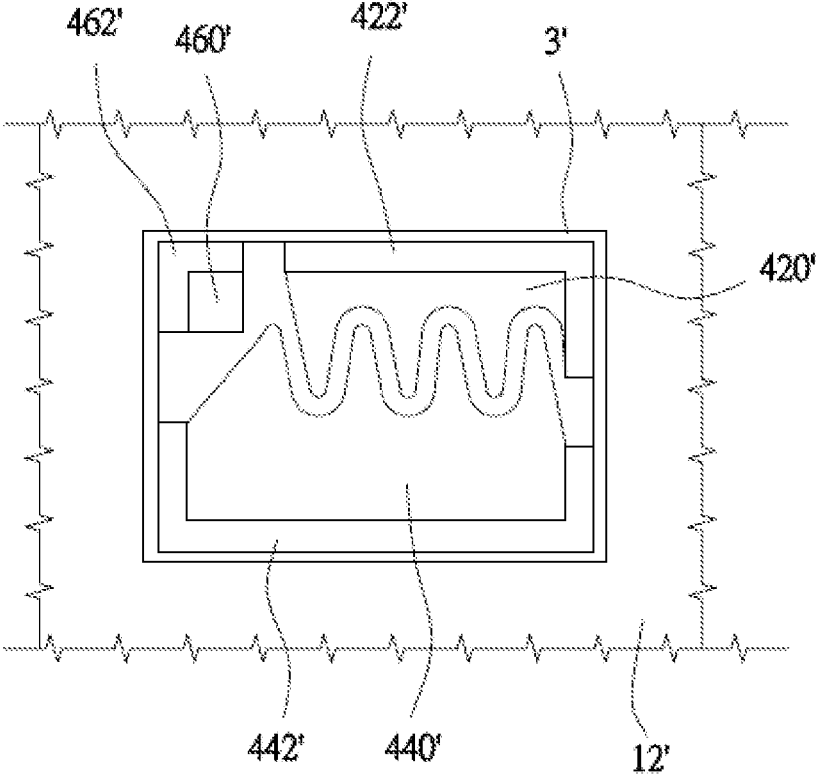
FIG. 9 is a top view of the pre-packaging circuit board according to the implementation of FIG. 8, wherein the circuit board has not been mounted with a power transistor.
FIG. 10 is a top view of post-packaging circuit board according to the implementation of FIG. 8.

Different from the first implementation in which only the source 52 and the gate 56 of the power transistor 5 are located on a same surface while the drain 54 is located on the opposite surface, the second implementation of the present disclosure relates to a power transistor construction, in which the source 52', drain 54', and gate 56' of a power transistor 5' are located on the same plane, as illustrated in FIG. 7. In FIGS. 8 to 10, a stepped metal electrode layer 4' comprises a source connecting pin 42', a drain connecting pin 44', and a gate connecting pin 46', wherein the source connecting pin 42' is partitioned into a thin pad portion 420' and a source connecting portion 422', the gate connecting pin 46' is partitioned into a thin pad portion 460' and a gate connecting portion 462', wherein the thin pad portions 420', 460' are thermally conductively provided on the second upper surface 22', while the source connecting portion 422' and the gate connecting portion 462' extend upward from the thin pad portions 420', 460' till being flush with the dielectric material layer 1' such that the source connecting portion 422', the gate connecting portion 462', and the thin pad portions 420', 460' extend in a generally bent manner; as to the drain connecting pin 44' in this implementation, it is defined with a drain thin pad portion 440' and a drain connecting portion 442' extending out from the drain thin pad portion 440', wherein the drain thin pad portion 440' is likewise thermally conductively provided on the second upper surface 22', while the drain connecting portion 442' extends upward from the drain thin pad portion 440' till being flush with the dielectric material layer 1', such that the drain connecting portion 442' and the drain thin pad portion 440' extend in in a generally bent manner.

Since the drain connecting pin 44' extends in a bent manner, the copper layer in the first implementation is eliminated; and the drain connecting pin 44' is provided at a position of the source connection pin 42' with a height exactly corresponding to the height of the gate connecting pin 46', wherein the source 52', the drain 54', and the gate 56' of the power transistor 5' are located on the same surface; therefore, the thin pad portion 420' of the source connecting pin 42', the thin pad portion 460' of the gate connecting pin 46', and the drain thin pad portion 440' of the drain connecting pin 44' are coplanar and mutually electrically insulated.

Afterwards, the dielectric material packaging (which may be epoxy resin adhesive) filling the via hole 10' is configured to encapsulate the second upper surface 22', the thin pad portion 420', the drain thin pad portion 440', and the power transistor 5' to thereby form a third upper surface 62' flush with the first upper surface 12'; via the dielectric material packaging, the source connecting portion 422' of the source connecting pin 42', the gate connecting portion 462' of the gate connecting pin 46', and the drain thin pad portion 440' of the drain connecting pin 44' are at least partially exposed to form contacts, facilitating docking with the source 52', the drain 54', and the gate 56' of the power transistor 5'; after the encapsulation is completed, polishing is performed such that the third upper surface 62' flush with the first upper surface 12', the source connecting portion 422', and the gate connecting portion 462' can have a flatter surface for contacting the drain connecting portion 442'; finally, the circuit layer 9' is provided above the first upper surface 12', the third upper surface 62', and the exposed source connecting pin 42', drain connecting pin 44', and gate connecting pin 46; furthermore, the circuit layer 9' may be disposed above the first upper surface 12' and the third upper surface 62' so as to be coplanar with the exposed source connecting pin 42', drain connecting pin 44', and gate connecting pin 46'.

In view of the above, when the source 52', drain 54', and gate 56' of the power transistor 5' are coplanar and exposed to the upper side of the circuit board, the heat energy produced from the power transistor may be conducted out towards beneath the circuit board via the large-footprint thermally conductive ceramic which is in thermally conductively connection with the power transistor; in this way, the temperature rise of the power transistor operating environment may be controlled further lower via the ceramic block thinner than conventional technologies, and the embedded construction may also clear the upper surface of the circuit board, yielding a large pin-footprint to allow for large current to smoothly flow in and out; which not only optimizes space utilization of the overall circuit board structure, but also improves the thermal conduction-electrical conduction isolation efficiency.

Figure 11:
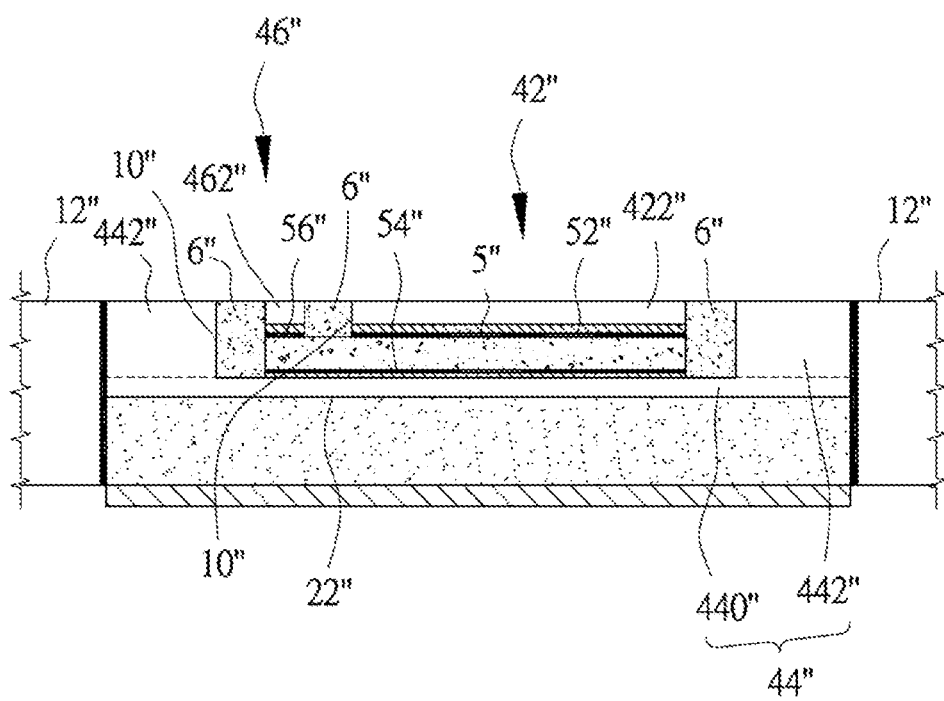
FIG. 11 is a section view of a packaged circuit board according to a third implementation of the disclosure.
Figure 12:
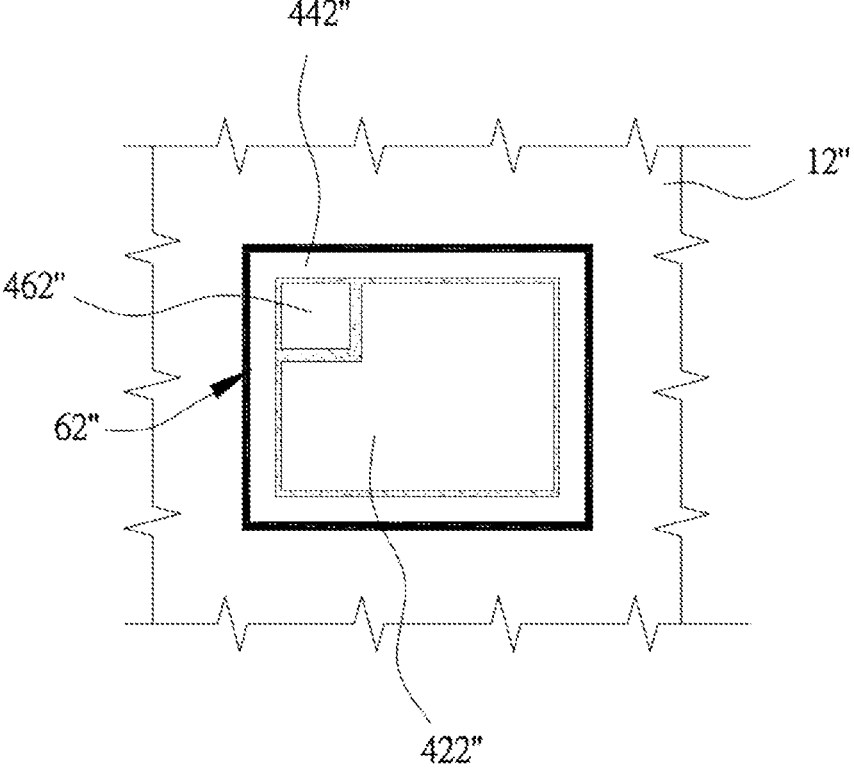
FIG. 12 is a top view of the packaged circuit board according to the implementation of FIG. 11.

Different from the first implementation in which the source and gate of the power transistor are disposed on the second upper surface of the heat-dissipating ceramic block while the drain is disposed on the opposite surface, in the implementation shown in FIGS. 11 and 12, the drain 54" is disposed proximate to and facing the second upper surface 22", while the source and gate are disposed on the opposite surface distant from the second upper surface. In other words, the drain, the source, and the gate are positioned reverse to the first implementation.

The power transistor 5" is conductively mounted with a drain connecting pin 44" on the plane of the drain 54" underneath. In this implementation, besides a copper layer disposed on the second upper surface 22" as a thin pad portion 440", the drain connecting pin 44" further comprises an encircling drain connecting portion 442" that expends upward in an "L"-shaped bent manner from the thin pad portion 440"; oppositely, the source 52" and gate 56" in this implementation face the upper side of the figures, such that the source connecting pin 42" only comprises a source connecting portion 422" and the gate connecting pin 46" only comprises a gate connecting portion 462".

Like the first implementation, this implementation also uses a dielectric material packaging 6" to fill the via hole 10", and the second upper surface 22", the drain connecting portion 442", and the power transistor 5" are encapsulated to form a third upper surface 62" flush with the first upper surface 12"; as to the source connecting portion 422", the gate connecting portion 462", and the drain connecting portion 442", they, after being polished, are exposed as a coplanar construction in the dielectric material packaging 6" to form contacts exposed to the upper side of the circuit board. In this way, on one hand, since the thickness of the heat-dissipating ceramic block is less than the overall thickness of the thermal conduction-electric conduction isolated circuit board, the temperature difference between the top surface and the bottom surface of the heat-dissipating ceramic block is lower, which enables a more efficient heat dissipation; on the other hand, the power transistor mounted on the heat-dissipating ceramic block is completely embedded in the via hole, which effectively reduces the circuit board footprint; while the source, drain, and gate of the power transistor may be exposed on the circuit board via their respective connecting portion; in addition, the flat and large welding footprint of the power transistor maximizes the conduction passageway, thereby completely meeting the requirement of press welding a plurality of parallel wires so as to allow large current to travel through, facilitating control of electric vehicles or other large-current operations.

What have been described are only preferred embodiments of the disclosure, which are not intended for limiting the scope of the disclosure; any simple equivalent variations and modifications to the claimed scope and the content of the specification of the disclosure shall fall within the scope of the disclosure.

We claim:

1. A thermal conduction-electrical conduction isolated printed circuit board with a ceramic substrate and a power transistor embedded, comprising:

a dielectric material layer comprising a first upper surface and a first lower surface opposite the first upper surface, the dielectric material layer being formed with at least one via hole running through the first upper surface and the first lower surface;

at least one heat-dissipating ceramic block correspondingly embedded in the via hole, comprising a second upper surface and a second lower surface, wherein the heat-dissipating ceramic block has a thermal conductivity higher than that of the dielectric material layer and a thickness less that of the dielectric material layer;

at least one securing portion which secures the embedded heat-dissipating ceramic block in the via hole of the dielectric material layer such that the second lower surface corresponds to the first lower surface;

a stepped metal electrode layer thermally conductively provided on the second upper surface, the stepped metal electrode layer at least comprising one of a source connecting pin or a drain connecting pin, the source connecting pin being partitioned into a thin pad portion and a source connecting portion extending from the thin pad portion, the drain connecting pin being partitioned into a thin pad portion and a drain connecting portion extending from the thin pad portion;

a power transistor electrically and thermally conductively mounted on the stepped metal electrode layer, the power transistor at least comprising a source, a gate, and a drain, wherein the source is electrically conductively connected to the source connecting pin, the drain is electrically conductively connected to the drain connecting pin;

wherein alternatively, the stepped metal electrode layer comprises the other one of the source connecting pin or the drain connecting pin, and a gate connecting pin, the source connecting pin being electrically connected to the source, the drain connecting pin being electrically connected to the drain, the gate connecting pin being electrically connected to the gate, wherein the drain connecting pin at least comprises a drain connecting portion, the source connecting pin at least comprises a source connecting portion, and the gate connecting pin at least comprises a gate connecting portion;

and a dielectric material packaging filling the via hole, wherein the dielectric material packaging encapsulates the second upper surface, the thin pad portion, and the power transistor, whereby to form a third upper surface flush with the first upper surface, and the third upper surface is configured to at least partially expose the source connecting portion of the source connecting pin, the drain connecting portion of the drain connecting pin, and the gate connecting portion of the gate connecting pin, respectively.

2. The thermal conduction-electrical conduction isolated printed circuit board with a ceramic substrate and a power transistor embedded according to claim 1, wherein the power transistor is a die.

3. The thermal conduction-electrical conduction isolated printed circuit board with a ceramic substrate and a power transistor embedded according to claim 2, wherein the source, the drain, and the gate of the power transistor are disposed on the same plane, wherein each of the source connecting pin, the drain connecting pin, and the gate connecting pin has a thin pad portion thermally conductively provided on the second upper surface, the thin pad portions being coplanar and electrically isolated from each other; and the source connecting portion, the drain connecting portion, and the gate connecting portion extend from their respective thin pad portion in a bent manner, respectively.

4. The thermal conduction-electrical conduction isolated printed circuit board with a ceramic substrate and a power transistor embedded according to claim 2, wherein the source and gate of the power transistor are disposed on a same surface, while the drain is disposed on an opposite surface relative to the surface; the thin pad portion of the source connecting pin and the thin pad portion of the gate connecting pin are coplanar and electrically isolated from each other, and the source connecting portion of the source connecting pin and the gate connecting portion of the gate connecting pin extend from respective thin pad portion in a bent manner, respectively; and the drain connecting portion is disposed on the opposite surface.

5. The thermal conduction-electrical conduction isolated printed circuit board with a ceramic substrate and a power transistor embedded according to claim 4, wherein the drain connecting portion is a copper layer disposed on the opposite surface of the power transistor.

6. The thermal conduction-electrical conduction isolated printed circuit board with a ceramic substrate and a power transistor embedded according to claim 5, wherein the drain connecting portion of the drain connecting pin further comprises an interface nano-silver adhesive layer disposed between the opposite surface and the copper layer of the power transistor.

7. The thermal conduction-electrical conduction isolated printed circuit board with a ceramic substrate and a power transistor embedded according to claim 2, wherein the drain of the power transistor is disposed proximal to and facing the second upper surface, and the source and the gate are disposed on an opposite surface distal from the second upper surface.

8. The thermal conduction-electrical conduction isolated printed circuit board with a ceramic substrate and a power transistor embedded according to claim 7, wherein the drain connecting pin comprises the thin pad portion and the drain connecting portion extending from the thin pad portion in a bent manner; and the source connecting portion and the gate connecting portion are disposed on the opposite surface in a mutually insulative and coplanar manner.

9. The thermal conduction-electrical conduction isolated printed circuit board with a ceramic substrate and a power transistor embedded according to claim 1, further comprising a circuit layer located above the first upper surface, the third upper surface, and the exposed source connecting pin, drain connecting pin, and gate connecting pin.

10. The thermal conduction-electrical conduction isolated printed circuit board with a ceramic substrate and a power transistor embedded according to claim 1, further comprising a circuit layer located above the first upper surface and the third upper surface; and wherein the exposed source connecting pin, drain connecting pin, and gate connecting pin are coplanar with the circuit layer.

* * * * *